(12) United States Patent
Xie et al.

(10) Patent No.: US 10,790,309 B2
(45) Date of Patent: Sep. 29, 2020

(54) CONDUCTIVE PATTERN STRUCTURE, MANUFACTURING METHOD THEREOF, ARRAY SUBSTRATE AND DISPLAY DEVICE

(71) Applicant: BOE TECHNOLOGY GROUP CO., LTD., Beijing (CN)

(72) Inventors: Dini Xie, Beijing (CN); Xiaojin Zhang, Beijing (CN); Wei Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/062,344

(22) PCT Filed: Nov. 7, 2017

(86) PCT No.: PCT/CN2017/109722
§ 371 (c)(1),
(2) Date: Jun. 14, 2018

(87) PCT Pub. No.: WO2018/192210
PCT Pub. Date: Oct. 25, 2018

(65) Prior Publication Data
US 2019/0280012 A1    Sep. 12, 2019

(30) Foreign Application Priority Data

Apr. 20, 2017 (CN) .......................... 2017 1 0263475

(51) Int. Cl.
*H01L 27/12* (2006.01)
*H01L 21/768* (2006.01)
(Continued)

(52) U.S. Cl.
CPC .......... *H01L 27/124* (2013.01); *H01L 21/768* (2013.01); *H01L 21/84* (2013.01);
(Continued)

(58) Field of Classification Search
None
See application file for complete search history.

(56) References Cited

U.S. PATENT DOCUMENTS 9,633,957 B2    4/2017 Hilsenbeck et al.
9,653,284 B2    5/2017 Li et al.
(Continued)

FOREIGN PATENT DOCUMENTS

CN    1909248 A    2/2007
CN    101270493 A    9/2008
(Continued)

OTHER PUBLICATIONS

International Search Report dated Feb. 8, 2018.
(Continued)

*Primary Examiner* — Steven B Gauthier
(74) *Attorney, Agent, or Firm* — Dilworth & Barrese, LLP.; Michael J. Musella, Esq.

(57) ABSTRACT

A conductive pattern structure is provided by the embodiment of present disclosure. The conductive pattern structure includes: a first metal pattern and a second metal pattern. The second metal pattern covers at least a portion of a side surface of the first metal pattern; and an activity of a metal material of the first metal pattern is weaker than an activity of a metal material of the second metal pattern. The embodiment of present disclosure prevents the side surface of the first metal pattern from being oxidized by forming the second metal pattern covering at least a portion of the side surface of the first metal pattern, in this way, the problem that the electrical conductivity of the first metal pattern is reduced is avoided, and the problem that product yield declining is avoided.

18 Claims, 4 Drawing Sheets

(51) Int. Cl.
*H01L 21/84* (2006.01)
*H01L 23/532* (2006.01)
*H01L 29/423* (2006.01)
*H01L 29/49* (2006.01)
*H01L 29/786* (2006.01)

(52) U.S. Cl.
CPC ...... *H01L 23/532* (2013.01); *H01L 23/53228* (2013.01); *H01L 23/53233* (2013.01); *H01L 23/53242* (2013.01); *H01L 23/53257* (2013.01); *H01L 27/12* (2013.01); *H01L 27/1259* (2013.01); *H01L 29/42384* (2013.01); *H01L 29/4908* (2013.01); *H01L 29/786* (2013.01)

(56) References Cited

U.S. PATENT DOCUMENTS

| | | | |
|---|---|---|---|
| 9,847,400 | B2 | 12/2017 | Kong et al. |
| 9,905,580 | B2 | 2/2018 | Ning et al. |
| 2003/0201436 | A1* | 10/2003 | Kim .................. H01L 29/41733 257/59 |
| 2008/0230393 | A1* | 9/2008 | Okazaki ............. C23C 18/1608 205/123 |
| 2014/0353669 | A1* | 12/2014 | Seo ...................... H01L 27/124 257/72 |
| 2015/0171154 | A1* | 6/2015 | Kang .................. H01L 27/3262 257/40 |
| 2017/0278867 | A1* | 9/2017 | Jeong .................. H01L 27/1248 |
| 2017/0352765 | A1* | 12/2017 | Imai ...................... G02F 1/1368 |
| 2018/0122914 | A1 | 5/2018 | Li et al. |
| 2018/0151647 | A1* | 5/2018 | Lee ..................... H01L 27/3246 |

FOREIGN PATENT DOCUMENTS

| | | |
|---|---|---|
| CN | 102983157 A | 3/2013 |
| CN | 103794651 A | 5/2014 |
| CN | 104332474 A | 2/2015 |
| CN | 104465786 A | 3/2015 |
| CN | 104766803 A | 7/2015 |
| CN | 104882489 A | 9/2015 |
| CN | 104992949 A | 10/2015 |
| CN | 105655313 A | 6/2016 |
| CN | 105762112 A | 7/2016 |

OTHER PUBLICATIONS

First Office Action in the priority Chinese application No. 201710263475.3 dated Mar. 4, 2020 and its English translation.
Second Chinese Office Action in corresponding Chinese Application No. 201710263475.3 dated Aug. 12, 2020.

* cited by examiner

CONDUCTIVE PATTERN STRUCTURE, MANUFACTURING METHOD THEREOF, ARRAY SUBSTRATE AND DISPLAY DEVICE

The present application claims the priority of the Chinese Patent Application No. 201710263475.3 filed on Apr. 20, 2017, which is incorporated herein by reference as part of the disclosure of the present application.

TECHNICAL FIELD

Embodiments of the present disclosure relate to a conductive pattern structure, a method for manufacturing the conductive pattern structure, an array substrate and a display device.

BACKGROUND

At present, in thin film transistor liquid crystal displays (TFT-LCDs), a material of gate lines, gate electrodes, source electrodes, drain electrodes or data lines is generally selected from a metal, such as Ta, Cr or Mo with a relatively stable chemical property and a relatively high resistivity, or an alloy of any combinations of Ta, Cr and Mo. In a case that the TFT-LCDs have small size and low resolution, a delay of gate electrode signals is not obvious, which makes an unobvious influence on display effect of a device including at least one of the TFT-LCDs. However, with the increasing of the size and the resolution of the TFT-LCDs, the length of the gate lines increases gradually, and a delay period of the gate electrode signals becomes longer. In a case that the delay period of the gate electrode signals increases to a certain extent, some pixels are not fully charged, which results in an uneven display brightness, in this way, a contrast of the TFT-LCDs is decreased, which seriously influences the quality of displaying image. Therefore, a low resistance metal such as Cu is used for manufacturing the gate lines, the gate electrodes, the source electrodes, the drain electrodes and the data lines to solve the above problems.

In a case that the low resistance metal is used for manufacturing metal lines or metal electrodes, the low resistance metal is easy to be oxidized, and metal ions of the low resistance metal are easy to diffuse into a semiconductor layer, which makes a performance of the thin film transistor deteriorates, in this way, a performance of a product including the thin film transistor is seriously affected. In a case that the metal lines or metal electrodes made of the low resistance metal are at a high temperature condition, the above problems are especially serious.

SUMMARY

At least one embodiment of the present disclosure provides a conductive pattern structure, and the conductive pattern structure comprises: a first metal pattern and a second metal pattern, in which the second metal pattern covers at least a portion of a side surface of the first metal pattern; an activity of a metal material of the first metal pattern is weaker than an activity of a metal material of the second metal pattern.

For example, in the conductive pattern structure provided by at least one embodiment of the present disclosure, the metal material of the first metal pattern comprises at least one of a copper-based metal and a silver-based metal.

For example, in the conductive pattern structure provided by at least one embodiment of the present disclosure, the metal material of the second metal pattern comprises at least one of nickel, molybdenum, niobium, aluminum and titanium.

For example, in the conductive pattern structure provided by at least one embodiment of the present disclosure, the copper-based metal comprises Cu, CuMo, CuTi, CuMoW, CuMoNb or CuMoTi; and the silver-based metal comprises Ag, AgMo, AgTi, AgMoW, AgMoNb or AgMoTi.

For example, in the conductive pattern structure provided by at least one embodiment of the present disclosure, in the copper-based metal, a mass percentage of copper is from about 90 wt % to about 100 wt %; in the silver-based metal, a mass percentage of silver is from about 90 wt % to about 100 wt %.

For example, the conductive pattern structure provided by at least one embodiment of the present disclosure, further comprises a buffer layer, wherein the first metal pattern is arranged on the buffer layer.

For example, in the conductive pattern structure provided by at least one embodiment of the present disclosure, a material of the buffer layer comprises at least one of Mo, Nb, Ti, MoW, MoNb, MoTi, WNb, WTi, TiNb, silicon nitride, silicon oxide and silicon oxynitride.

For example, the conductive pattern structure provided by at least one embodiment of the present disclosure, further comprises a third metal pattern covering an upper surface of the first metal pattern.

For example, in the conductive pattern structure provided by at least one embodiment of the present disclosure, a material of the third metal pattern comprises at least one of Mo, Nb, Ti, MoW, MoNb, MoTi, WNb, WTi and TiNb.

At least one embodiment of the present disclosure further provides an array substrate, and the array substrate comprises any one of the conductive pattern structures described above.

At least one embodiment of the present disclosure further provides a display device, and the display device comprises any one of the array substrates described above.

At least one embodiment of the present disclosure further provides a method for manufacturing a conductive pattern structure, and the manufacturing method comprises: forming a first metal pattern; forming a second metal pattern on at least a portion of a side surface of the first metal pattern, in which an activity of a metal material of the first metal pattern is weaker than an activity of a metal material of the second metal pattern.

For example, in the manufacturing method provided by at least one embodiment of the present disclosure, the forming the second metal pattern on at least a portion of the side surface of the first metal pattern comprises: placing a base substrate provided with the first metal pattern in a solution containing an ion of the metal material of the second metal pattern to form the second metal pattern covering at least a portion of the side surface of the first metal pattern.

For example, in the manufacturing method provided by at least one embodiment of the present disclosure, the metal material of the first metal pattern comprises at least one of a copper-based metal and a silver-based metal.

For example, in the manufacturing method provided by at least one embodiment of the present disclosure, the metal material of the second metal pattern comprises at least one of nickel, molybdenum, niobium, aluminum and titanium.

For example, in the manufacturing method provided by at least one embodiment of the present disclosure, the solution containing the ion of the metal material of the second metal pattern comprises: chlorides of nickel, molybdenum, niobium, aluminum, or titanium; nitrates of nickel, molybdenum, niobium, aluminum, or titanium; or sulphate solution of nickel, molybdenum, niobium, aluminum, or titanium.

For example, in the manufacturing method provided by at least one embodiment of the present disclosure, before forming the first metal pattern, the manufacturing method further comprises forming a buffer layer.

For example, in the manufacturing method provided by at least one embodiment of the present disclosure, a material of the buffer layer comprises at least one of Mo, Nb, Ti, MoW, MoNb, MoTi, WNb, WTi, TiNb, silicon nitride, silicon oxide and silicon oxynitride.

For example, the manufacturing method provided by at least one embodiment of the present disclosure, further comprises: forming a third metal pattern on an upper surface of the first metal pattern.

For example, in the manufacturing method provided by at least one embodiment of the present disclosure, a material of the third metal pattern comprises at least one of Mo, Nb, Ti, MoW, MoNb, MoTi, WNb, WTi and TiNb.

BRIEF DESCRIPTION OF THE DRAWINGS

In order to clearly illustrate the technical solution of the embodiments of the disclosure, the drawings of the embodiments will be briefly described. It is apparent that the described drawings are only related to some embodiments of the disclosure and thus are not limitative of the disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

In a manufacturing process of a display device, an active layer of a thin film transistor (TFT) which has been industrialized is mainly made of amorphous silicon, polycrystalline silicon, monocrystalline silicon, metal oxide or carbon nanotubes. Metal lines or metal electrodes of the above mentioned thin film transistors are usually made of low resistance metals, the low resistance metals are easy to be oxidized, and a conductivity of the metal lines and the metal electrodes which have been oxidized is reduced, which seriously affects properties of the thin film transistor. In addition, metal ions of the low resistance metals are easy to diffuse into the active layer of the thin film transistors, which makes a performance of the thin film transistor deteriorates. Phenomena that the metal lines or the metal electrodes are oxidized and the metal ions diffuse are especially serious in a case that the active layer of the thin film transistor is made of metal oxide.

Figure 1:
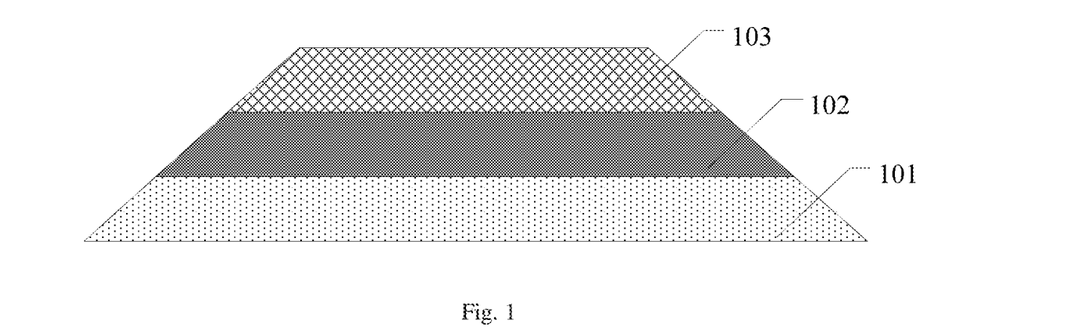
FIG. 1 is a schematic diagram of a sectional structure of a conductive pattern structure.
Figure 2:
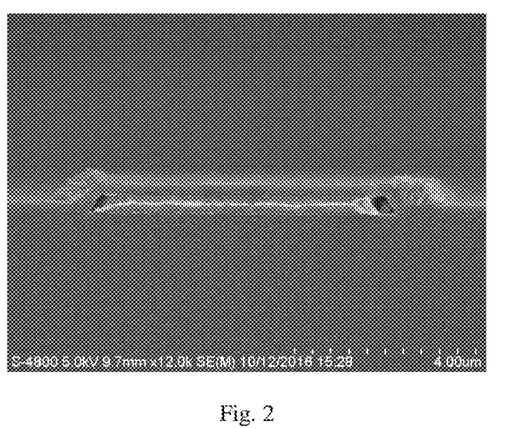
FIG. 2 is a scanning electron microscope diagram of a MoNb/Cu/MoNb metal stack that a side surface of Cu metal layer is oxidated.

For example, a first buffer layer and a second buffer layer are formed on an upper side and a lower side of a low resistance metal layer respectively, to prevent the low resistance metal layer from being oxidized and to reduce the phenomenon that the metal ions of the low resistance metal layer diffuse into a semiconductor layer. For example, FIG. 1 is a schematic diagram of a sectional structure of a conductive pattern structure. As illustrated in FIG. 1, after the first buffer layer 101 and the second buffer layer 103 are formed on the upper side and the lower side of the low resistance metal layer 102 respectively, and after a subsequent process that a three-layer structure made of the first buffer layer, the low resistance metal layer and the second buffer layer is etched, a side surface of the low resistance metal layer in the middle of the three-layer structure is exposed to air. In subsequent steps such as depositing an insulating film and high temperature annealing process, the side surface of the low resistance metal layer 102 is easy to be oxidized. In addition, problems that the low-resistance metal layer 102 is indented inwardly and the metal lines are disconnected are caused. For example, FIG. 2 is a scanning electron microscope diagram of a MoNb/Cu/MoNb metal stack that a side surface of Cu metal layer is oxidized. As illustrated in FIG. 2, a loose protrusion is formed on the side surface of the copper metal layer, and the loose protrusion is an oxide of copper.

At least one embodiment of the present disclosure provides a conductive pattern structure. The conductive pattern structure comprises a first metal pattern and a second metal pattern, the second metal pattern covers at least a portion of a side surface of the first metal pattern, and an activity of a metal material of the first metal pattern is weaker than an activity of a metal material of the second metal pattern.

In at least one embodiment of the present disclosure, the second metal pattern covering at least a portion of the side surface of the first metal pattern is formed on the first metal pattern to prevent the side surface of the first metal pattern from being oxidized, in this way, a problem that electrical conductivity of the first metal pattern is reduced is avoided, and further a problem that product yield is reduced is avoided. In addition, as described below, the conductive pattern structure provided by at least one embodiment of the present disclosure further reduces requirements for production equipment and external environment, in this way, complexity of the manufacturing process of the conductive pattern structure is reduced and the production cost is reduced.

It should be noted that, the metal activity refers to a flexibility of a metal being replaced. According to the metal arrangement order in the metal activity sequence table, the metal activity is gradually decreased from front to back. In the metal activity sequence table, a position of the metal material for forming the first metal pattern is behind a position of the metal material for forming the second metal pattern.

It should be noted that, the second metal pattern covering at least a portion of the side surface of the first metal pattern refers to that the second metal pattern covers an entirety of the side surface or only a portion of the side surface of the first metal pattern. For the purpose of better protecting the first metal pattern, the second metal pattern covers the entirety of the side surface of the first metal pattern.

It should be noted that, in a case that the second metal pattern covers the side surface of the first metal pattern, the second metal pattern for example further covers an upper surface and/or a lower surface of the first metal pattern.

Figure 3:
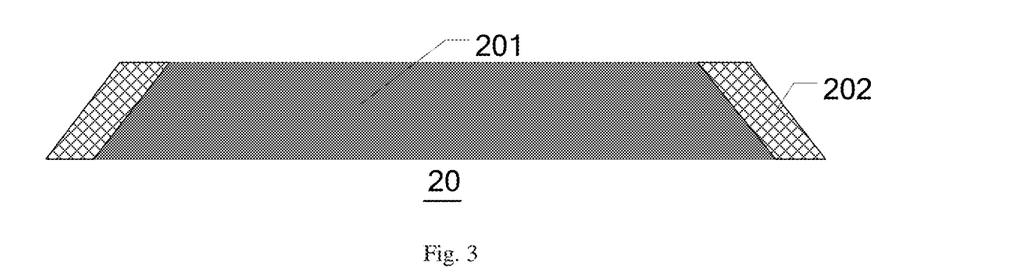
FIG. 3 is a schematic diagram of a sectional structure of a conductive pattern structure provided by at least one embodiment of the present disclosure.

For example, FIG. 3 is a schematic diagram of a sectional structure of the conductive pattern structure provided by at least one embodiment of the present disclosure. As illustrated in FIG. 3, in the conductive pattern structure 20, the second metal pattern 202 covers the side surface of the first metal pattern 201 to completely isolate the side surface of the first metal pattern 201 from the outside environment, and to prevent the first metal pattern 201 from being oxidized, in this way, the problem that the electrical conductivity of the first metal pattern 201 is reduced is avoided.

As illustrated in FIG. 3, the side surface of the first metal pattern 201 is covered by the second metal pattern 202, and the second metal pattern 202 is exposed. In this situation, the second metal pattern 202 may be easy to be oxidized. However, even if the second metal pattern 202 is oxidized, a thin and compact oxide film is rapidly formed on the surface of the second metal pattern 202, which prevents oxidation of the second metal pattern 202 from further proceeding.

For example, the metal material of the first metal pattern is a low resistance metal material, and the low resistance metal material comprises at least one of a copper-based metal and a silver-based metal, that is, the low resistance metal material comprises one of the copper-based metal or the silver base metal, or comprises both of the copper-based metal and the silver-based metal.

For example, the copper-based metal comprises Cu, CuMo, CuTi, CuMoW, CuMoNb or CuMoTi; and the silver-based metal comprises Ag, AgMo, AgTi, AgMoW, AgMoNb or AgMoTi.

For example, in the copper-based metal, a mass percentage of copper is from about 90 wt % to about 100 wt %, for example, the mass percentage of the copper is 90 wt %, 92 wt %, 94 wt %, 96 wt %, 98 wt % or 100 wt %; in the silver-based metal, a mass percentage of silver is from about 90 wt % to about 100 wt %, for example, the mass percentage of the silver is 90 wt %, 92 wt %, 94 wt %, 96 wt %, 98 wt % or 100 wt %. It should be noted that, the mass percentage of the copper and the mass percentage of the silver are not limited to the scopes described above in the embodiments of the present disclosure, and fluctuation of 10% of the mass percentages of copper and silver are also included in the scope of the embodiments of present disclosure.

For example, the metal material of the second metal pattern comprises at least one of nickel, molybdenum, niobium, aluminum and titanium. In the metal activity sequence table, these metals are located in front of copper, and the oxides of these metals have good compactness, which prevents the oxidation of the second metal pattern 202 from further proceeding.

For example, a thickness of the first metal pattern is from about 200 nm to 400 nm, for example, 200 nm, 250 nm, 300 nm, 350 nm or 400 nm.

For example, a thickness of the second metal pattern is from about 10 nm to 50 nm, for example, 10 nm, 20 nm, 25 nm, 30 nm, 35 nm, 40 nm or 50 nm.

It should be noted that, the thickness of the first metal pattern and the thickness of the second metal pattern are not limited to the above scopes in the embodiments of the present disclosure, fluctuation of 10% of the thickness of the first metal pattern and fluctuation of 10% of the thickness of the second metal pattern are also included in the scope of the embodiments of present disclosure.

Figure 4:
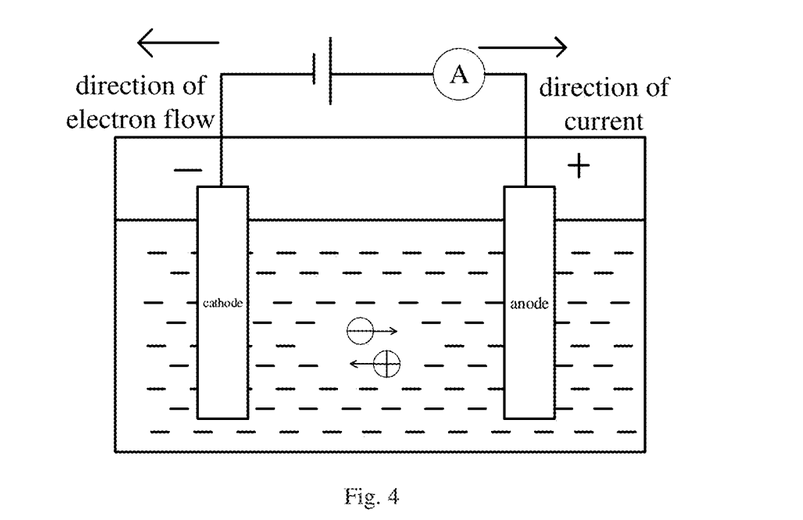
FIG. 4 is a working mechanism diagram of the electrolysis cell.

For example, the process of forming the second metal covering at least a portion of the side surface of the first metal pattern is realized by an electrolysis cell reaction. It should be noted that, the process of converting electric energy into chemical energy is called as electrolysis, a device for implementing such process is an electrolytic cell, and a working medium of the electrolytic cell is an electrolyte solution. For example, FIG. 4 is a working mechanism diagram of the electrolysis cell. The working mechanism of the electrolysis cell is: anions are oxidized by losing electrons on an anode, and the lost electrons flow through an external circuit to a positive electrode of an external power, or, in a case that the material of the anode is an active electrode material, the anode is oxidized by losing electrons and cations corresponding to the metal of the anode are formed; the cations are reduced by obtaining electrons supplied by a cathode of the external power on the cathode.

For example, the electrolytic cell reaction in at least one embodiment of the present disclosure includes the following examples:

First example: the metal material of the first metal pattern is copper metal element, the copper metal element is used as the cathode, the anode is an inert electrode (for example, the anode is formed of platinum or palladium), and the electrolyte solution is a nickel chloride solution ($NiCl_2$). Anions $Cl^{-1}$ in the electrolyte solution move to the anode and the anions $Cl^{-1}$ are oxidized on the anode. Cations $Ni^{2+}$ move toward the cathode and the cations $Ni^{2+}$ obtain electrons on the cathode to form nickel metal element.

The electrolysis cell reaction is as follows:

Anode: $2Cl^{-1} - 2e^- = Cl_2(g)$

Cathode: $Ni^{2+} + 2e^- = Ni$

By the above electrochemical reaction, a layer of the nickel metal element is formed on the cathode formed of the copper metal element. That is, the second metal pattern (made of nickel metal element) is formed on the first metal pattern (made of copper metal element).

It should be noted that, the above copper metal element may be replaced by silver metal element, the copper-based metal alloy or the silver-based metal alloy; the nickel chloride solution ($NiCl_2$) may be replaced by a nickel sulfate solution ($NiSO_4$), a nickel nitrate solution ($Ni(NO_3)_2$), an aluminum chloride solution ($AlCl_3$), an aluminum sulfate solution ($Al_2(SO_4)_3$), an aluminum nitrate solution($Al(NO_3)_3$), an ionic solution of sulfate of molybdenum, niobium or titanium, an ionic solution of nitrate of molybdenum, niobium or titanium, or an ionic solution of chloride of molybdenum, niobium or titanium; and the electrolysis cell reaction is similar to the anodic reaction and the cathodic reaction mentioned above.

Second example: the metal material of the first metal pattern is copper metal element, the copper metal element is used as the cathode, the material of the anode is nickel metal element, and the electrolyte solution is nickel chloride solution ($NiCl_2$). The material of the anode is nickel metal element, that is, the anode is made of active electrode material, the anode loses electrons and is oxidized to from metal ions $Ni^{2+}$. The metal ions $Ni^{2+}$ formed by oxidizing the anode and the metal ions $Ni^{2+}$ in the solution move to the cathode, and the metal ions $Ni^{2+}$ obtain electrons on the cathode to form the nickel metal element.

The electrolysis cell reaction is as follows:

Anode: $Ni-2e^-=Ni^{2+}$

Cathode: $Ni^{2+}+2e^-=Ni$

By the electrochemical reaction, the layer of the nickel metal element is formed on the cathode of the copper metal element. That is, the second metal pattern (made of nickel metal element) is formed on the first metal pattern (made of copper metal element).

It should be noted that, the above copper metal element may be replaced by silver metal element, the copper-based metal alloy or the silver-based metal alloy; the nickel chloride solution ($NiCl_2$) may be replaced by the nickel sulfate solution ($NiSO_4$), the nickel nitrate solution ($Ni(NO_3)_2$), the aluminum chloride solution ($AlCl_3$), the aluminum sulfate solution ($Al_2(SO_4)_3$), the aluminum nitrate solution ($Al(NO_3)_3$), the ionic solution of sulfate of molybdenum, niobium or titanium, the ionic solution of nitrate of molybdenum, niobium or titanium, the ionic solution of chloride of molybdenum, niobium or titanium, or aqueous solution; and the electrolysis cell reaction is similar to the anodic reaction and the cathodic reaction mentioned above.

For example, metals that are more active than copper or silver and are prone to be passivated, such as nickel, aluminum, molybdenum, niobium and titanium, are selected to form the second metal pattern 202. In a case that the nickel, aluminum, molybdenum, niobium and titanium are oxidized in air, dense oxide films are formed rapidly, which prevents oxidation reactions from further proceeding. In a case that the conductive pattern structure according to the embodiments of the disclosure is applied to the array substrate, in subsequent steps such as depositing an insulating film and high temperature annealing process during manufacturing the array substrate, the oxidation reaction of the first metal pattern does not occurred, which effectively prevents the deterioration of yield caused by oxidation and corrosion of the first metal pattern formed by copper metal material or silver metal material.

For example, a metal film is deposited by a magnetron sputtering method, and then the metal film is patterned to form the second metal pattern. However, the process of magnetron sputtering needs to be completed in a vacuum chamber, which requires expensive equipment and a high production cost. The manufacturing process of forming the second metal pattern on the side surface of the first metal pattern by the electrolytic cell reaction method provided by the embodiments of the present disclosure is simple, and the method does not require harsh reaction conditions, in this way, the manufacturing cost is saved.

Figure 5:
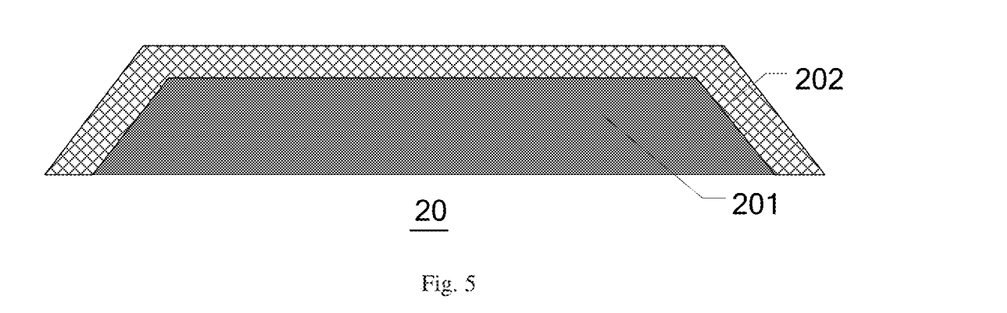
FIG. 5 is another schematic diagram of the sectional structure of the conductive pattern structure provided by at least one embodiment of the present disclosure.

For example, FIG. 5 is another schematic diagram of the sectional structure of the conductive pattern structure provided by at least one embodiment of the present disclosure. The second metal pattern 202 covers the upper surface and the entirety of the side surface of the first metal pattern 201, which prevents the upper surface of the first metal pattern 201 from being oxidized.

Figure 6:
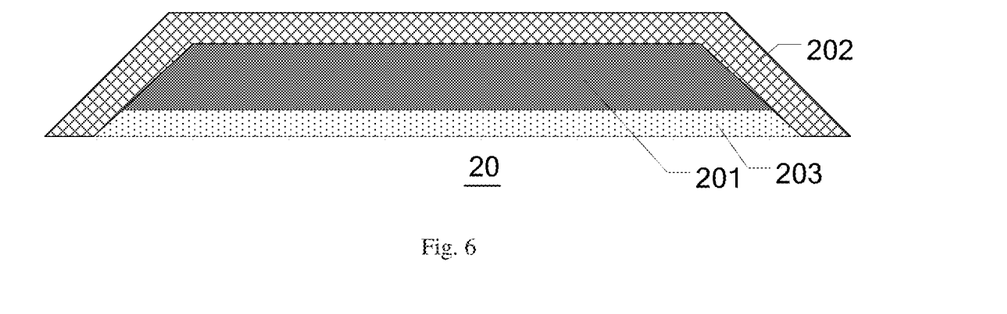
FIG. 6 is still another schematic diagram of the sectional structure of the conductive pattern structure provided by at least one embodiment of the present disclosure.

FIG. 6 is still another schematic diagram of the sectional structure of the conductive pattern structure provided by at least one embodiment of the present disclosure. As illustrated in FIG. 6, the conductive pattern structure further comprises a buffer layer 203, and the first metal pattern 201 is arranged on the buffer layer 203. For example, a material for forming the buffer layer 203 includes an inorganic nonmetal material or a metal material that is not prone to occur an ion diffusion phenomenon. The buffer layer 203 prevents the lower surface of the first metal pattern 201 from being oxidized and prevents the metal ions in the first metal pattern 201 from diffusing. For example, the metal material comprises at least one of Mo, Nb, Ti, MoW, MoNb, MoTi, WNb, WTi and TiNb, and the inorganic nonmetal material comprises at least one of silicon nitride, silicon oxide and silicon oxynitride.

As illustrated in FIG. 6, the second metal pattern 202 is further formed on a side surface of the buffer layer 203, and the second metal pattern 202 is further formed on the upper surface of the first metal pattern 201.

For example, a thickness of the buffer layer 203 is from about 20 nm to about 30 nm, for example, 20 nm, 25 nm or 30 nm. It should be noted that, the thickness of the buffer layer is not limited to the scope described above in the embodiments of the present disclosure, and fluctuation of 10% of the thickness of the buffer layer is also included in the scope of the embodiments of present disclosure.

Figure 7:
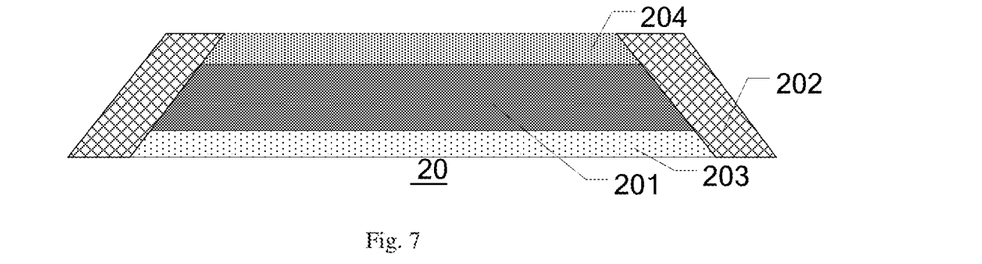
FIG. 7 is still another schematic diagram of the sectional structure of the conductive pattern structure provided by at least one embodiment of the present disclosure.

For example, FIG. 7 is still another schematic diagram of the sectional structure of the conductive pattern structure provided by at least one embodiment of the present disclosure. As illustrated in FIG. 7, the conductive pattern structure 20 further comprises a third metal pattern 204 covering the upper surface of the first metal pattern 201. The third metal pattern 204 prevents the upper surface of the first metal pattern 201 from being oxidized and prevents the metal ions in the first metal pattern 201 from diffusing.

For example, a material for forming the third metal pattern 204 comprises at least one of Mo, Nb, Ti, MoW, MoNb, MoTi, WNb, WTi and TiNb.

At least one embodiment of the present disclosure further provides an array substrate, and the array substrate comprises any one of the conductive pattern structures described above.

For example, the conductive pattern structure is at least one of a gate electrode, a gate line, a first source drain electrode, a second source drain electrode, a data line and a common electrode line in the array substrate.

For example, a thin film transistor included in the array substrate mainly comprises an amorphous silicon thin film transistor, a polycrystalline silicon thin film transistor, a monocrystalline silicon thin film transistor, a metal oxide thin film transistor or a carbon nanotube thin film transistor. The metal oxide thin film transistor is widely used in the array substrate for manufacturing a display device. The metal oxide thin film transistor has the advantages of high carrier mobility, in this way, the thin film transistor is very small, which improves the resolution of flat panel displays and improves the display effect of display devices. At the same time, the metal oxide thin film transistor has the advantages of less uneven characteristics, low cost of material and process, low process temperature, high transparency of semiconductor layer and large band gap. The following is illustrated by an example that the thin film transistor in the array substrate is a bottom gate metal oxide thin film transistor.

Figure 8:
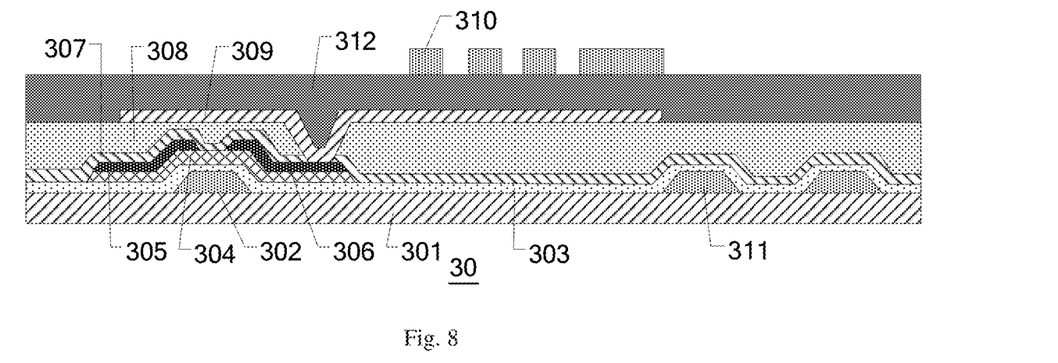
FIG. 8 is a schematic diagram of a sectional structure of an array substrate provided by at least one embodiment of the present disclosure.

FIG. 8 is a schematic diagram of a sectional structure of the array substrate provided by at least one embodiment of the present disclosure. As illustrated in FIG. 8, the array substrate 30 comprises: a base substrate 301, a gate electrode 302, a gate insulation layer 303, an active layer 304, a first source drain electrode 305, a second source drain electrode 306, an organic insulation layer 307, a passivation layer 308, a first electrode 309, a first insulation layer 312, a second electrode 310 and a common electrode line 311 arranged on the base substrate 301.

For example, the gate electrode 302, the gate line (not illustrated in FIG. 8), the first source drain electrode 305, the second source drain electrode 306, the data line (not illustrated in FIG. 8), and the common electrode line 311 on the array substrate 30 are any one of the conductive pattern structures in the embodiments of the present disclosure respectively. In this way, the second metal pattern (for example, a pattern of at least one of nickel, molybdenum, niobium, aluminum and titanium) is formed on the side surface of the first metal pattern (for example, a copper metal pattern or a silver metal pattern), which effectively prevents the deterioration of yield caused by deep oxidation and corrosion of the first metal pattern formed by copper metal material or silver metal material.

For example, in a case that the nickel, aluminum, molybdenum, niobium and titanium are oxidized in air, thin and dense oxide films are formed, which prevents oxidation reactions from further proceeding. In a case that the conductive pattern structure is applied to the array substrate, in subsequent steps such as depositing an insulating film and high temperature annealing process during manufacturing the array substrate, the oxidation reaction of the first metal pattern does not occur, which effectively prevents the deterioration of yield caused oxidation and corrosion of the first metal pattern formed by copper metal material or silver metal material.

For example, a metal film is deposited by a magnetron sputtering method, and then the metal film is patterned to form the second metal pattern. However, the process of magnetron sputtering needs to be completed in a vacuum chamber, which requires expensive equipment and high production cost. The manufacturing process of forming the second metal pattern on the side surface of the first metal pattern by the electrolytic cell reaction method provided by the embodiments of the present disclosure is simple, and the method does not require harsh reaction conditions, in this way, the manufacturing cost is saved.

For example, the active layer 304 is a metal oxide semiconductor. The material of the active layer 304 comprises IGZO, HIZO, IZO, a-InZnO, a-InZnO, ZnO, $In_2O_3$:Sn, $In_2O_3$:Mo, $Cd_2SnO_4$, ZnO:Al, $TiO_2$:Nb or Cd—Sn—O.

For example, the material of the gate insulation layer 303 in at least one embodiment of the present disclosure comprises at least one of silicon oxide, silicon nitride, and silicon oxynitride. The material of the gate insulation layer 303 may also be other inorganic insulating materials having same or similar properties as the above substances.

For example, the base substrate 301 comprises a transparent insulating substrate, and a material of the transparent insulating substrate is glass, quartz, plastic or other suitable materials.

For example, the material of the organic insulating layer 307 comprises one or more of polyimide, tetrafluoroethylene perfluoroalkoxy vinyl ether copolymer, acrylic resin and polyethylene terephthalate.

For example, the material of the passivation layer 308 comprises one or more of silicon nitride, silicon oxide, silicon oxynitride, titanium dioxide, and aluminium trioxide.

For example, the first electrode 309 is a pixel electrode and the second electrode 310 is a common electrode. Alternatively, the first electrode 309 is the common electrode and the second electrode 310 is the pixel electrode.

For example, the first electrode 309 and the second electrode 310 are formed by transparent conductive materials or metal materials. For example, the transparent conductive materials comprise indium tin oxide (ITO), indium zinc oxide (IZO), indium gallium oxide (IGO), gallium zinc oxide (GZO), Zinc oxide (ZnO), indium oxide ($In_2O_3$), alumina zinc oxide (AZO), carbon nanotube and so on. The metal materials comprise silver, aluminum, etc.

For example, the order of forming the first electrode 309 and forming the second electrode 310 may be changed, that is, the second electrode 310 is arranged above the first electrode 309, or the first electrode 309 is arranged above the second electrode 310, which is not limited here.

For example, the thin film transistor in the array substrate provided by at least one embodiment of the present disclosure is a bottom gate type thin film transistor, for example, a thin film transistor with an etching stopping layer structure (ES) or a thin film transistor with a back channel etching structure (BCE), and the thin film transistor may also be a top gate type thin film transistor or a double gate type thin film transistor.

Figure 9:
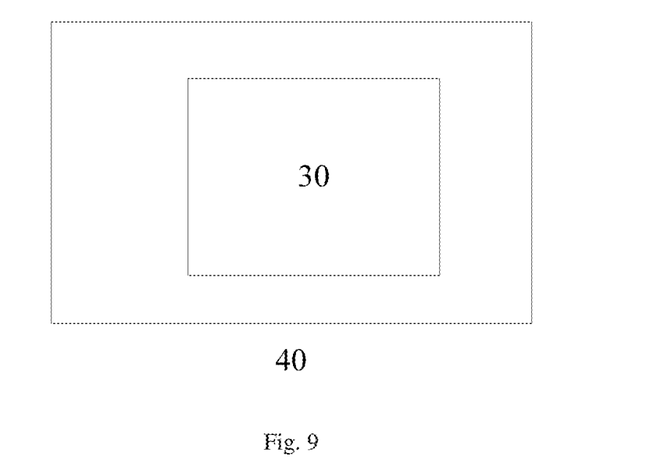
FIG. 9 is a block diagram of a display device provided by at least one embodiment of the present disclosure.

At least one embodiment of the present disclosure further provides a display device, and the display device comprises any one of the above mentioned array substrates. For example, FIG. 9 is a block diagram of the display device provided by at least one embodiment of the present disclosure. As illustrated in FIG. 9, the display device 40 includes the array substrate 30.

An example of the display device 40 is a liquid crystal display device, the array substrate and an opposite substrate are arranged opposite to each other to form a liquid crystal cell, and the liquid crystal cell is filled with liquid crystal material. For example, the opposite substrate is a color filter substrate. Pixel electrodes corresponding to sub-pixels of the array substrate respectively are used to control a degree of rotation of the liquid crystal material by applying an electric field so as to perform a display operation. In some examples, the liquid crystal display device further comprises a backlight source for providing backlight to the array substrate.

For example, other example of the display device is an organic light-emitting diode (OLED) display device or an electronic paper display device, etc.

For example, other structures of the display device 40 may refer to a conventional design. The display device for example is: a mobile phone, a tablet computer, a television, a display, a notebook computer, a digital picture frame, a navigation system and any other product or component having a display function. Other essential components of the display device which should be understood by those skilled in the art are included, which is omitted herein and should not be a restriction to the present disclosure. The implementation of the display device refers to the embodiments of the above-mentioned opposite substrate, and detailed descriptions will be omitted here.

Figure 10:
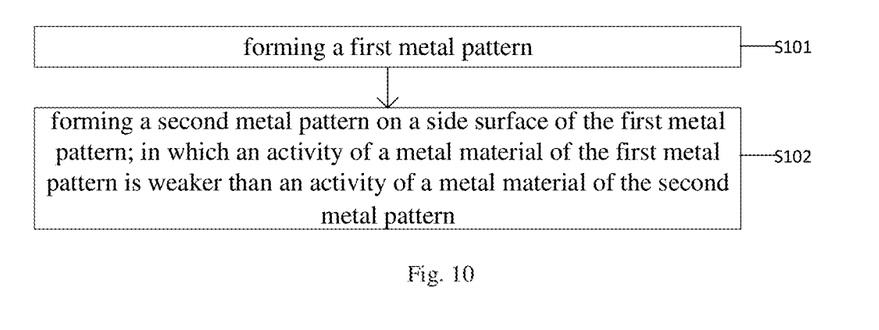
FIG. 10 is a flow diagram of a method for manufacturing a conductive pattern structure provided by at least one embodiment of the present disclosure.

At least one embodiment of the present disclosure further provides a method for manufacturing a conductive pattern structure, for example, FIG. 10 is a flow diagram of the method for manufacturing the conductive pattern structure provided by at least one embodiment of the present disclosure. For example, the manufacturing method comprises:

S101: forming a first metal pattern;

The process of forming the first metal pattern includes: depositing a first metal film on a base substrate, and patterning the first metal film to form the first metal pattern.

For example, the first metal film with a thickness from about 200 nm to about 400 nm is deposited by using the method of sputtering or thermal evaporation. For example, the thickness of the first metal film is 200 nm, 250 nm, 300 nm, 350 nm, or 400 nm. It should be noted that, the thickness of the first metal film is not limited to the above scope in the embodiments of the present disclosure, fluctuation of 10% of the thickness of the first metal film is also included in the scope of the embodiments of present disclosure.

For example, the base substrate is a transparent insulating substrate, and the material of the transparent insulating substrate is glass, quartz, plastic or other suitable materials.

For example, the material of the first metal pattern is a low resistance metal material, and the low resistance metal material comprises at least one of a copper-based metal and a silver-based metal, that is, the low resistance metal material comprises one of the copper-based metal or the silver-base metal, or it comprises both of the copper-based metal and the silver-based metal.

For example, the copper-based metal comprises Cu, CuMo, CuTi, CuMoW, CuMoNb or CuMoTi; and the silver-based metal comprises Ag, AgMo, AgTi, AgMoW, AgMoNb or AgMoTi.

For example, in the copper-based metal, the mass percentage of copper is from about 90 wt % to about 100 wt %, for example, the mass percentage of the copper is 90 wt %, 92 wt %, 94 wt %, 96 wt %, 98 wt % or 100 wt %; in the silver-based metal, the mass percentage of silver is from about 90 wt % to about 100 wt %, for example, the mass percentage of the silver is 90 wt %, 92 wt %, 94 wt %, 96 wt %, 98 wt % or 100 wt %. It should be noted that, the mass percentage of the copper and the mass percentage of the silver are not limited to the scopes described above in the embodiments of the present disclosure, and fluctuation of 10% of the mass percentages is also included in the scope of the embodiments of present disclosure.

For example, the process of patterning the first metal film includes: coating a layer of photoresist on the first metal film, then exposing the photoresist by using a mask plate and developing the photoresist, in this way, a photoresist removal region and a photoresist reserved region are formed, and the photoresist reserved region corresponds to a region of the first metal pattern (for example, the gate electrode, the gate line, the first source drain electrode, the second source drain electrode, the data line or the common electrode line in the array substrate), the photoresist removal region corresponds to a region other than the region of the first metal pattern; etching the first metal film in the photoresist removal region completely by an etching process; stripping the remaining photoresist to form the first metal pattern.

S102: forming a second metal pattern on a side surface of the first metal pattern; in which an activity of a metal material of the first metal pattern is weaker than an activity of a metal material of the second metal pattern.

The metal activity refers to a flexibility of a metal being replaced. According to the metal arrangement order in the metal activity sequence table, the metal activity is gradually decreased from front to back. In the metal activity sequence table, the position of the metal material for forming the first metal pattern is behind the position of the metal material for forming the second metal pattern.

For example, in the conductive pattern structure, the second metal pattern covers the side surface of the first metal pattern to completely isolate the side surface of the first metal pattern from the outside environment, and to prevent the first metal pattern from being oxidized, in this way, the problem that the electrical conductivity of the first metal pattern is reduced is avoided.

For example, in the manufacturing method provided by at least one embodiment of the present disclosure, the process of forming the second metal covering the side surface of the first metal pattern is realized by an electrolysis cell reaction. For example, the process includes: placing the base substrate provided with the first metal pattern in a solution containing an ion of the metal material for forming the second metal pattern, and converting electrical energy into chemical energy under an action of an external current, then forming the second metal pattern covering the side surface of the first metal pattern.

For example, the electrolytic cell reaction in at least one embodiment of the present disclosure includes the following examples:

First example: the metal material of the first metal pattern is copper metal element, the copper metal element is used as the cathode, the anode is an inert electrode (for example, the anode is formed of platinum or palladium), and the electrolyte solution is a nickel chloride solution ($NiCl_2$). Anions $Cl^{-1}$ in the electrolyte solution move to the anode and the anions $Cl^{-1}$ are oxidized on the anode. Cations $Ni^{2+}$ move toward the cathode and the cations $Ni^{2+}$ obtain electrons on the cathode to form nickel metal element.

The electrolysis cell reaction is as follows:

Anode: $2Cl^{-1}-2e^-=Cl_2(g)$

Cathode: $Ni^{2+}+2e^-=Ni$

By the above electrochemical reaction, a layer of the nickel metal element is formed on the cathode formed of the copper metal element. That is, the second metal pattern (made of nickel metal element) is formed on the first metal pattern (made of copper metal element).

It should be noted that, the above copper metal element may be replaced by silver metal element, the copper-based metal alloy or the silver-based metal alloy; the nickel chloride solution ($NiCl_2$) may be replaced by a nickel sulfate solution ($NiSO_4$), a nickel nitrate solution ($Ni(NO_3)_2$), an aluminum chloride solution ($AlCl_3$), an aluminum sulfate solution ($Al_2(SO_4)_3$), an aluminum nitrate solution ($Al(NO_3)_3$), an ionic solution of sulfate of molybdenum, niobium or titanium, an ionic solution of nitrate of molybdenum, niobium or titanium, or an ionic solution of chloride of molybdenum, niobium or titanium; and the electrolysis cell reaction is similar to the anodic reaction and the cathodic reaction mentioned above.

Second example: the metal material of the first metal pattern is copper metal element, the copper metal element is used as the cathode, the material of the anode is nickel metal element, and the electrolyte solution is nickel chloride solution ($NiCl_2$). The material of the anode is nickel metal element, that is, the anode is made of active electrode material, the anode loses electrons and is oxidized to from metal ions $Ni^{2+}$. The metal ions $Ni^{2+}$ formed by oxidizing the anode and the metal ions $Ni^{2+}$ in the solution move to the cathode, and the metal ions $Ni^{2+}$ obtain electrons on the cathode to form the nickel metal element.

The electrolysis cell reaction is as follows:

Anode: $Ni-2e^-=Ni^{2+}$

Cathode: $Ni^{2+}+2e^-=Ni$

By the electrochemical reaction, the layer of the nickel metal element is formed on the cathode of the copper metal element. That is, the second metal pattern (made of nickel metal element) is formed on the first metal pattern (made of copper metal element).

It should be noted that, the above copper metal element may be replaced by silver metal element, the copper-based metal alloy or the silver-based metal alloy; the nickel chloride solution ($NiCl_2$) may be replaced by the nickel sulfate solution ($NiSO_4$), the nickel nitrate solution ($Ni(NO_3)_2$), the aluminum chloride solution ($AlCl_3$), the aluminum sulfate solution ($Al_2(SO_4)_3$), the aluminum nitrate solution ($Al(NO_3)_3$), the ionic solution of sulfate of molybdenum, niobium or titanium, the ionic solution of nitrate of molybdenum, niobium or titanium, the ionic solution of chloride of molybdenum, niobium or titanium, or aqueous solution; and the electrolysis cell reaction is similar to the anodic reaction and the cathodic reaction mentioned above.

For example, in a case that the nickel, aluminum, molybdenum, niobium and titanium are oxidized in air, thin and dense oxide films are formed, which prevents oxidation reactions from further proceeding. In a case that the conductive pattern structure is applied to the array substrate, in subsequent steps such as depositing an insulating film and high temperature annealing process during manufacturing the array substrate, the oxidation reaction of the first metal pattern does not occurred, which effectively prevents the deterioration of yield caused by oxidation and corrosion of the first metal pattern formed by copper metal material or silver metal material.

For example, a metal film is deposited by a magnetron sputtering method, and then the metal film is patterned to form the second metal pattern. However, the process of magnetron sputtering needs to be completed in a vacuum chamber, which requires expensive equipment and high production cost. The manufacturing process of forming the second metal pattern on the side surface of the first metal pattern by the electrolytic cell reaction method provided by the embodiments of the present disclosure is simple, and the method does not require harsh reaction conditions, in this way, the manufacturing cost is saved.

For example, in the manufacturing method provided by the embodiments of the present embodiment, before forming the first metal pattern, the manufacturing method further includes forming a buffer layer. For example, before depositing the first metal film on the base substrate, the manufacturing method further includes forming the buffer film by the method of magnetron sputtering or the method of chemical vapor deposition, and forming the buffer layer by a patterning process.

For example, the process of depositing the buffer film comprises continuous depositing the film of oxide, nitride or oxygen-nitrogen compound by the method of plasma enhanced chemical vapor deposition (PECVD), and then etching the film to form the buffer layer. The corresponding reaction gas is selected from $SiH_4$, $NH_3$, $N_2$, $SiH_2Cl_2$ or $N_2$. The method of PECVD has the advantages of low temperature, fast deposition rate, good film forming quality, less pinholes and less cracking.

For example, a material of the buffer layer comprises at least one of Mo, Nb, Ti, MoW, MoNb, MoTi, WNb, WTi, TiNb, silicon nitride, silicon oxide and silicon oxynitride.

For example, the manufacturing method of the conductive pattern structure further comprises forming a third metal pattern on an upper surface of the first metal pattern.

For example, the material for forming the third metal pattern comprises at least one of Mo, Nb, Ti, MoW, MoNb, MoTi, WNb, WTi and TiNb.

For example, the process of forming the third metal pattern refers to the above process of forming the first metal pattern, which is omitted herein.

For example, the buffer film, the first metal film and the third metal film are formed in sequence, and then the buffer layer, the first metal pattern and the third metal pattern are formed by a single patterning process with one mask.

The conductive pattern structure, the manufacturing method of the conductive pattern structure, the array substrate and the display device provided by the embodiments of the present disclosure have at least one of the following beneficial effects:

(1) in the conductive pattern structure provided by at least one embodiment the present disclosure, the second metal pattern covering at least a portion of the side surface of the first metal pattern is formed on the first metal pattern to prevent the side surface of the first metal pattern from being oxidized, in this way, a problem that electrical conductivity of the first metal pattern is reduced is avoided, and further a problem that product yield is reduced is avoided.

(2) the conductive pattern structure provided by at least one embodiment of the present disclosure further reduces requirements for production equipment and external environment, so that complexity of the manufacturing process of the conductive pattern structure is reduced and the production cost is reduced.

(3) the conductive pattern structure provided by at least one embodiment of the present disclosure reduces the production cost.

Please note that:

(1) the drawings of the embodiments of the present disclosure are only related to the structures mentioned in the embodiments of the present disclosure, and other structures can be obtained by general designs;

(2) for the sake of clarity, sizes of layers or regions in the drawings for describing the embodiments of the present disclosure are not drawn according to an actual scale but are exaggerated or diminished, it can be understood that, in a case that a component such as a layer, a film, a region, or a substrate is called "on" or "under" another component, the component is "on" or "under" another component directly, or there may be an intermediate component.

(3) the embodiments of the present disclosure and the features therein can be combined with each other in the absence of conflict.

What are described above is related to only the illustrative embodiments of the disclosure and not limitative to the scope of the disclosure. The scopes of the disclosure are defined by the accompanying claims.

What is claimed is:

1. A conductive pattern structure, provided on a base substrate, comprising: a first metal pattern, a second metal pattern, and a third metal pattern covering an upper surface of the first metal pattern relative to the base substrate,
wherein the second metal pattern, without covering an upper surface of the third metal pattern, covers at least a portion of a side surface along a layer thickness direction of the first metal pattern and at least a portion of a side surface along a layer thickness direction of the third metal pattern;
a distance of an upper surface of the second metal pattern relative to the base substrate is substantially equal to a distance of the upper surface of the third metal pattern relative to the base substrate; and
an activity of a metal material of the first metal pattern is weaker than an activity of a metal material of the second metal pattern.

2. The conductive pattern structure according to claim 1, wherein the metal material of the first metal pattern comprises at least one selected from a group consisting of a copper-based metal and a silver-based metal.

3. The conductive pattern structure according to claim 2, wherein the copper-based metal comprises Cu, CuMo, CuTi, CuMoW, CuMoNb or CuMoTi; and the silver-based metal comprises Ag, AgMo, AgTi, AgMoW, AgMoNb or AgMoTi.

4. The conductive pattern structure according to claim 2, wherein a mass percentage of copper is from about 90 wt % to about 98 wt % in the copper-based metal; a mass percentage of silver is from about 90 wt % to about 98 wt % in the silver-based metal.

5. The conductive pattern structure according to claim 1, wherein the metal material of the second metal pattern comprises at least one selected from a group consisting of nickel, molybdenum, niobium, aluminum and titanium.

6. The conductive pattern structure according to claim 1, further comprising a buffer layer, wherein the first metal pattern is arranged on the buffer layer.

7. The conductive pattern structure according to claim 6, wherein a material of the buffer layer comprises at least one selected from a group consisting of Mo, Nb, Ti, MoW, MoNb, MoTi, WNb, WTi, TiNb, silicon nitride, silicon oxide and silicon oxynitride.

8. The conductive pattern structure according to claim 1, wherein a material of the third metal pattern comprises at least one selected from a group consisting of Mo, Nb, Ti, MoW, MoNb, MoTi, WNb, WTi and TiNb.

9. An array substrate, comprising the conductive pattern structure according to claim 1.

10. A display device, comprising the array substrate according to claim 9.

11. A method for manufacturing a conductive pattern structure, comprising:
forming a first metal pattern on a base substrate;
forming a third metal pattern on an upper surface of the first metal pattern; and
forming a second metal pattern, without covering an upper surface of the third metal pattern, on at least a portion of a side surface along a layer thickness direction of the first metal pattern and at least a portion of a side surface along a layer thickness direction of the third metal pattern, wherein a distance of an upper surface of the second metal pattern relative to the base substrate is substantially equal to a distance of the upper surface of the third metal pattern relative to the base substrate, and an activity of a metal material of the first metal pattern is weaker than an activity of a metal material of the second metal pattern.

12. The manufacturing method according to claim 11, wherein the forming the second metal pattern comprises: placing the base substrate provided with the first metal pattern in a solution containing an ion of the metal material of the second metal pattern to form the second metal pattern by an electrolysis cell reaction.

13. The manufacturing method according to claim 12, wherein the solution containing the ion of the metal material of the second metal pattern comprises: chlorides of nickel, molybdenum, niobium, aluminum, or titanium; nitrates of nickel, molybdenum, niobium, aluminum, or titanium; or sulphate solution of nickel, molybdenum, niobium, aluminum, or titanium.

14. The manufacturing method according to claim 11, wherein the metal material of the first metal pattern comprises at least one selected from a group consisting of a copper-based metal and a silver-based metal.

15. The manufacturing method according to claim 14, wherein the metal material of the second metal pattern comprises at least one selected from a group consisting of nickel, molybdenum, niobium, aluminum and titanium.

16. The manufacturing method according to claim 11, wherein before forming the first metal pattern, the manufacturing method further comprises forming a buffer layer.

17. The manufacturing method according to claim 16, wherein a material of the buffer layer comprises at least one selected from a group consisting of Mo, Nb, Ti, MoW, MoNb, MoTi, WNb, WTi, TiNb, silicon nitride, silicon oxide and silicon oxynitride.

18. The manufacturing method according to claim 11, wherein a material of the third metal pattern comprises at least one selected from a group consisting of Mo, Nb, Ti, MoW, MoNb, MoTi, WNb, WTi and TiNb.

* * * * *